(12) United States Patent
Pietambaram et al.

(10) Patent No.: US 11,978,685 B2
(45) Date of Patent: May 7, 2024

(54) GLASS CORE PATCH WITH IN SITU FABRICATED FAN-OUT LAYER TO ENABLE DIE TILING APPLICATIONS

(71) Applicant: Intel Corporation, Santa Clara, CA (US)

(72) Inventors: Srinivas Pietambaram, Chandler, AZ (US); Robert L. Sankman, Phoenix, AZ (US); Rahul Manepalli, Chandler, AZ (US); Gang Duan, Chandler, AZ (US); Debendra Mallik, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1000 days.

(21) Appl. No.: 16/522,494

(22) Filed: Jul. 25, 2019

(65) Prior Publication Data

US 2021/0028080 A1   Jan. 28, 2021

(51) Int. Cl.
| | |
|---|---|
| *H01L 23/15* | (2006.01) |
| *H01L 23/31* | (2006.01) |
| *H01L 23/495* | (2006.01) |
| *H01L 23/498* | (2006.01) |
| *H01L 23/538* | (2006.01) |

(52) U.S. Cl.
CPC .......... *H01L 23/15* (2013.01); *H01L 23/3121* (2013.01); *H01L 23/49503* (2013.01); *H01L 23/49827* (2013.01); *H01L 23/5381* (2013.01)

(58) Field of Classification Search
None
See application file for complete search history.

(56) References Cited

U.S. PATENT DOCUMENTS

| | | | | |
|---|---|---|---|---|
| 8,546,955 | B1 * | 10/2013 | Wu | H01L 23/5384 |
| | | | | 257/723 |
| 2007/0200211 | A1 * | 8/2007 | Kobayashi | H01L 21/486 |
| | | | | 257/676 |
| 2015/0021081 | A1 * | 1/2015 | Mitarai | H05K 3/4697 |
| | | | | 29/846 |
| 2017/0004990 | A1 * | 1/2017 | Kang | H01L 21/561 |
| 2018/0350684 | A1 * | 12/2018 | Mandal | H01L 21/56 |
| 2020/0335458 | A1 * | 10/2020 | Chen | H01Q 21/28 |

* cited by examiner

*Primary Examiner* — Vongsavanh Sengdara
(74) *Attorney, Agent, or Firm* — Schwabe, Williamson & Wyatt, P.C.

(57) ABSTRACT

Embodiments disclosed herein include electronic packages and methods of forming such packages. In an embodiment, the electronic package comprises a glass substrate, with a plurality of first pads on a first surface of the glass substrate, a plurality of second pads on a second surface of the glass substrate that is opposite from the first surface, a plurality of through glass vias (TGVs), wherein each TGV electrically couples a first pad to a second pad, wherein the plurality of first pads have a first pitch, and wherein the plurality of second pads have a second pitch that is greater than the first pitch, a bridge substrate over the glass substrate, a first die electrically coupled to first pads and the bridge substrate, and a second die electrically coupled to first pads and the bridge substrate, wherein the bridge substrate electrically couples the first die to the second die.

18 Claims, 14 Drawing Sheets

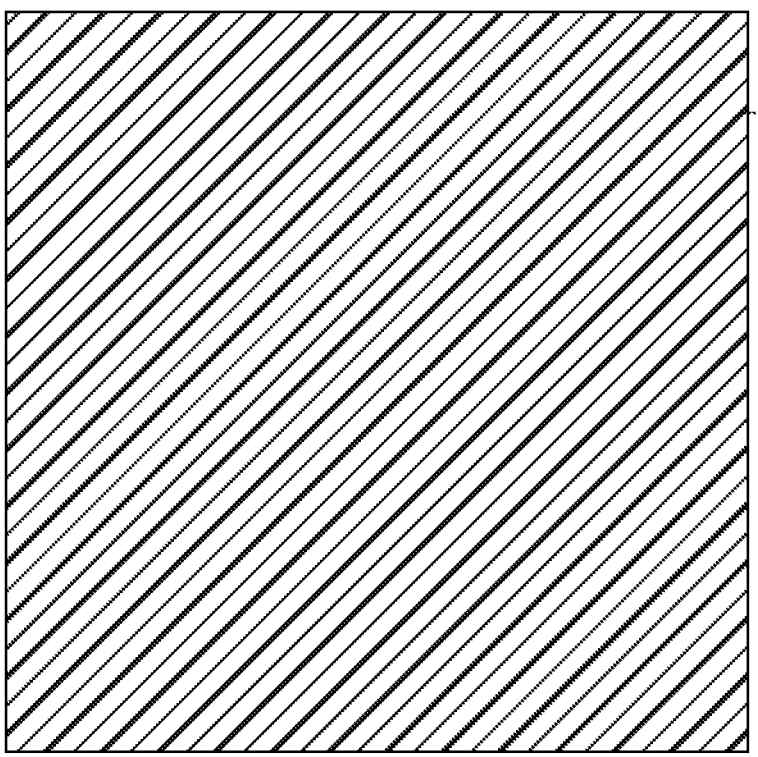
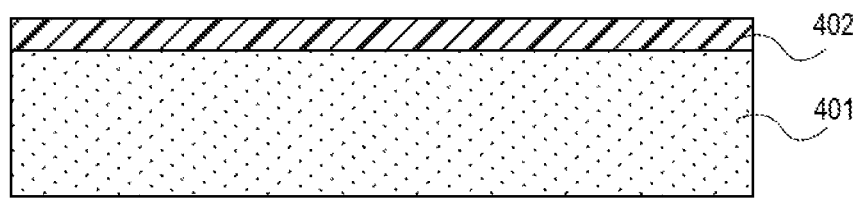
FIG. 4A
FIG. 4B

US 11,978,685 B2

GLASS CORE PATCH WITH IN SITU FABRICATED FAN-OUT LAYER TO ENABLE DIE TILING APPLICATIONS

TECHNICAL FIELD

Embodiments of the present disclosure relate to semiconductor devices, and more particularly to a multi-die package with a glass core patch that includes an in situ fabricated fan-out layer.

BACKGROUND

The demand for miniaturization of form factor and increased levels of integration for high performance are driving sophisticated packaging approaches in the semiconductor industry. One such approach is to use die partitioning to enable miniaturization of small form factor and high performance. Such architectures depend on fine die-to-die interconnects to couple the partitioned dies together. Embedded multi-die interconnect bridges (EMIBs) have been used to provide the fine die-to-die interconnects. However, EMIBs also have their own integration challenges.

One challenge is that EMIBs suffer from a high cumulative bump thickness variation (BTV). BTV is becoming an even greater engineering hurdle as more EMIBs are included in a package and as the sizes of the EMIBs increase. Placing the EMIBs onto a glass patch has been proposed to reduce the BTV and improve warpage. However, the glass patch is a thick substrate that has low thermal conductivity. Accordingly, thermocompression bonding (TCB) is not suitable for the mid-level interconnects (MLIs). Accordingly, the pitch of the MLIs needs to be increased in order to accommodate alternative bonding techniques, such as traditional chip attach module (CAM) process. Increasing the pitch of the MLIs requires the use of one or more redistribution layers disposed over the glass patch. The redistribution layers negate the BTV benefits provided by the glass, and is not a desirable solution.

BRIEF DESCRIPTION OF THE DRAWINGS

FIG. 4A is a plan view illustration of a carrier substrate with an adhesive, in accordance with an embodiment.

FIG. 4B is a cross-sectional illustration of the carrier substrate in FIG. 4A, in accordance with an embodiment.

EMBODIMENTS OF THE PRESENT DISCLOSURE

Figure 1A:
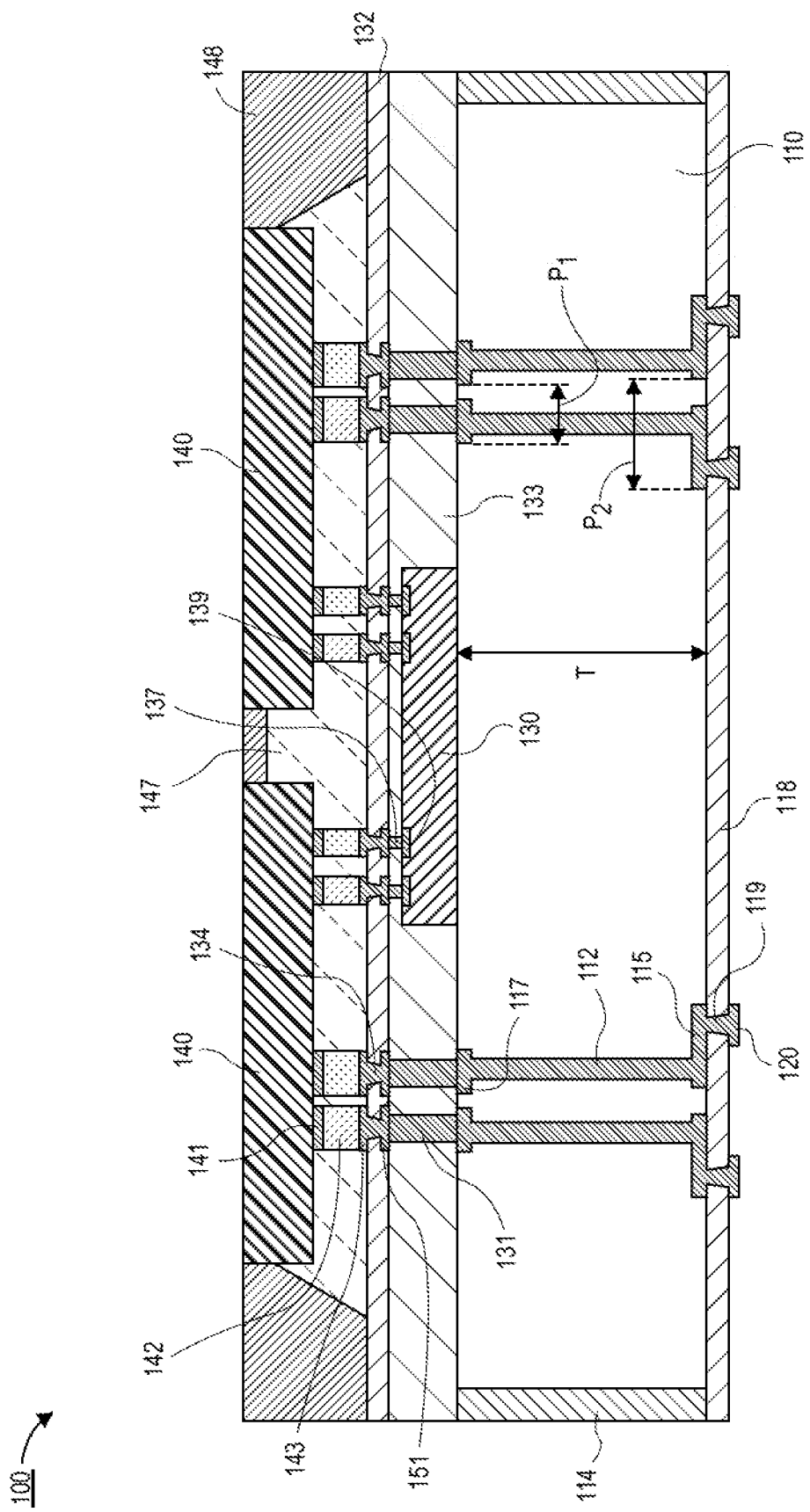
FIG. 1A is a cross-sectional illustration of an electronic package with a glass patch with an integrated fan-out layer, in accordance with an embodiment.

Described herein are multi-die packages with a glass core patch that includes an in-situ fabricated fan-out layer, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, partitioned die architectures are limited, at least in part, by the interconnect architectures used to couple the partitioned dies together. For example, the use of embedded multi-die interconnect bridge (EMIB) architectures is limited by bump thickness variation (BTV) considerations. Attempts to improve BTV in EMIB architectures by using a glass patch have been unsuccessful to date. Particularly, the glass patch requires the use of CAM techniques for mid-level interconnects (MLIs). Since CAM requires larger bump pitches, a redistribution layer (RDL) must be added to the glass patch to accommodate the pitch translation. The RDL negatively impacts thickness uniformity, negating the benefits of using a glass patch.

Accordingly, embodiments disclosed herein include an electronic package that comprises a glass patch with an integrated fan-out layer. The integrated fan-out layer is entirely within the glass substrate of the patch. As such, the fan-out layer does not contribute to thickness non-uniformity. In an embodiment, the fan-out layer may be formed using a lithographic process that directly patterns the glass substrate. For example, the glass patch may be a photo-definable glass substrate.

The use of such a glass patch allows for the BTV benefits of a glass substrate to be realized without also experiencing the negatives of an RDL. That is, glass patches in accordance with embodiments disclosed herein provide an integrated fan-out structure that allows for pitch translation in order to accommodate the larger MLI pitch needed for the CAM processing needed in conjunction with the thick glass patch. Particularly, the reductions in BTV of the electronic package allow for a plurality of EMIBs to be integrated into the electronic package and/or allow for larger EMIBs to be used. For example, the larger EMIBs may include active EMIB devices (i.e., EMIBs that include passive interconnections and active regions with transistors or the like).

Referring now to FIG. 1A, a cross-sectional illustration of an electronic package 100 is shown, in accordance with an embodiment. In an embodiment, the electronic package 100 comprises a glass patch 110. The glass patch 110 serves as a base that supports a plurality of dies 140. In an embodiment, the plurality of dies 140 may be electrically coupled to each other by one or more bridges 130. The bridge 130 may be attached to a surface of the glass patch 110. In the illustrated embodiment, the bridge 130 is directly attached to the glass patch 110, but it is to be appreciated that an adhesive may attach the bridge 130 to the glass patch 110 in some embodiments. In an embodiment, the plurality of dies 140 may be any type of dies. For example, the dies 140 may be processor dies, memory dies, graphics dies, or the like. In an embodiment, the dies 140 may be embedded in a mold layer 148. Underfill layer 147 may also partially embed the dies 140 and surround interconnects below the dies 140.

In an embodiment, the dies 140 may have first level interconnects (FLIs) that connect to the bridge 130 and to the glass patch 110. For example, die pads 141 may be attached to pads 143 by an FLI 142. For example, the FLI 142 may be a copper bump, a solder, or any other suitable FLI interconnect architecture. The pads 143 may be over a solder resist 132. Vias 134 through the solder resist 132 may be connected to pads 151. The pads 151 may be disposed over a dielectric layer 133 that embeds the bridge 130. In an embodiment, the pads 151 may be over pillars 131 and pillars 137. The pillars 131 may be coupled to first pads 117 of the glass patch 110, and the pillars 137 may be coupled to pads 139 of the bridge 130.

In an embodiment, the glass patch 110 may have a thickness T. In an embodiment, the thickness T may be greater than approximately 50 μm. In some embodiments, the thickness T may be between approximately 50 μm and 300 μm. In some other embodiments, the thickness T may be between approximately 300 μm and 600 μm. The relatively large thickness of the glass patch 110 allows for improvements to warpage control and, therefore, provides improved BTV.

The glass patch 110 may comprise first pads 117 along a first surface of the glass patch 110 and second pads 115 along a second (opposite) surface of the glass patch 110. In an embodiment, the first pads 117 may have a first pitch $P_1$ and the second pads 115 may have a second pitch $P_2$. The second pitch $P_2$ is larger than the first pitch $P_1$. The second pads 115 may have a pitch $P_2$ that is suitable for MLI connections formed with a CAM process. For example, the second pitch $P_2$ may be greater than 100 μm. In a particular embodiment, the second pitch $P_2$ may be approximately 160 μm or greater. In an embodiment, the first pitch $P_1$ may be suitable for providing FLI interconnects. For example, the first pitch $P_1$ may be substantially equal to the pitch of the FLIs 142 that provides connections to the dies 140. In an embodiment, the first pads 117 are each electrically coupled to different ones of the second pads 115 by through glass vias (TGVs) 112.

In an embodiment, the second pads 115 may be referred to as a fan-out layer in some embodiments. That is, the second pads 115 extend laterally away from the TGVs 112 in order to provide pitch translation. Since the pitch translation is implemented entirely within the glass patch 110, there is no need for additional RDL layers. For example, a solder resist layer 118 with vias 119 and pads 120 do not provide any additional pitch translation. Furthermore, the interconnects between the die 140 and the first pads 117 do not require any pitch translation. For example, pillars 131, pads 151, vias 134, pads 143, and FLIs 142 are substantially aligned over each other, without the need for horizontal translation. That is, in some embodiments, no pitch translation is implemented by layers above or below the glass patch 110. Accordingly, there is no need to include additional RDL layers that negatively impact BTV.

In an embodiment, the glass patch 110 may be lined with a mold layer 114. The mold layer 114 may be a residual artifact from the processing operations used to assemble the electronic package 100, and will be described in greater detail below. Particularly, the mold layer 114 allows for singulation of individual electronic packages 100 from a panel without needing to cut through a glass substrate.

Figure 1B:
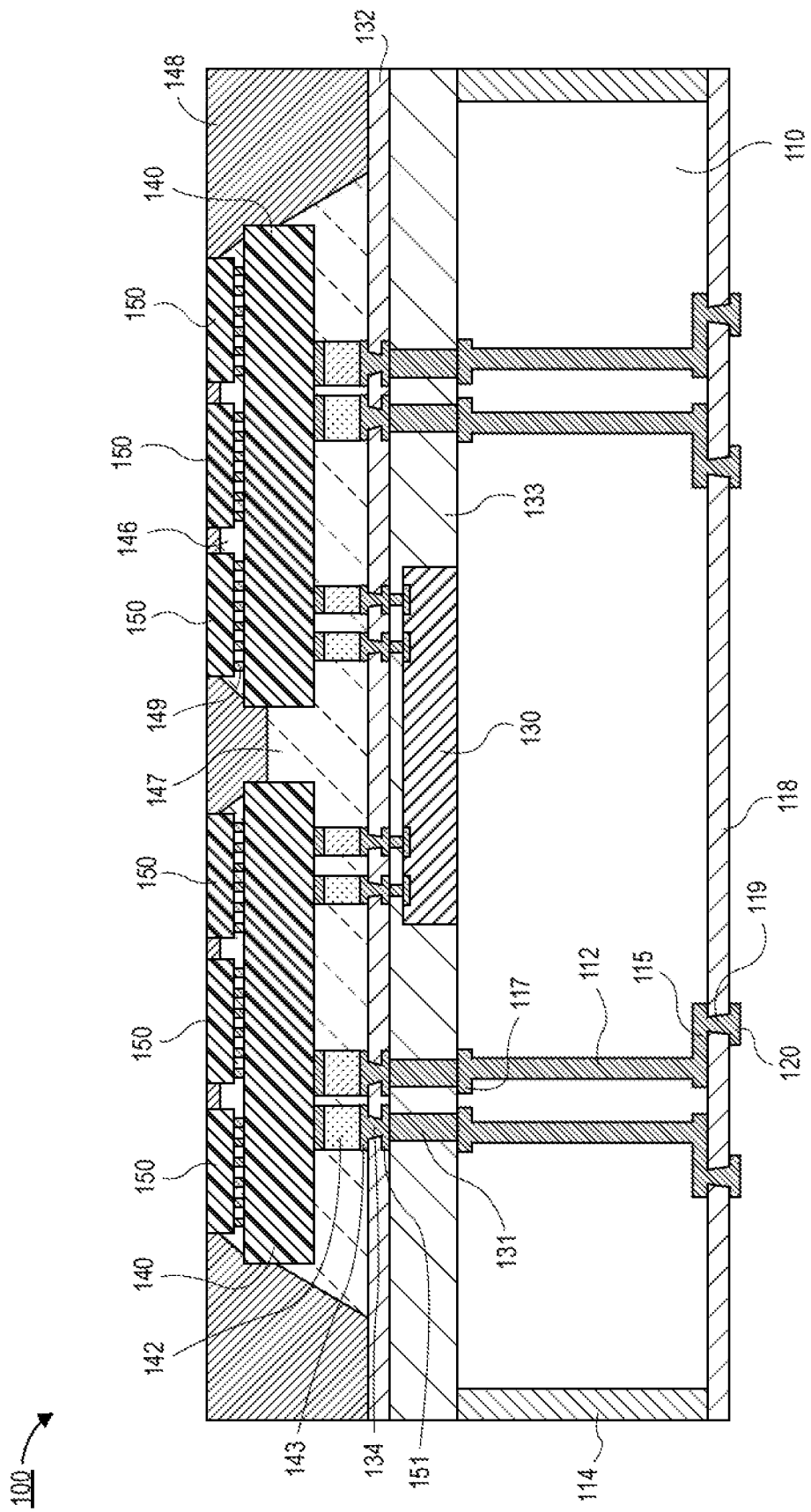
FIG. 1B is a cross-sectional illustration of an electronic package with a plurality of dies and a glass patch with an integrated fan-out layer, in accordance with an embodiment.

Referring now to FIG. 1B, a cross-sectional illustration of an electronic package 100 is shown, in accordance with an additional embodiment. In an embodiment, the electronic package 100 in FIG. 1B may be substantially similar to the electronic package 100 in FIG. 1A, with the exception that a plurality of dies 150 may be attached to each of the dies 140. In an embodiment, the dies 150 may comprise transistors fabricated at a first process node and the dies 140 may comprise transistors fabricated at a second process node that is less advanced than the first process node. In some embodiments, the dies 140 are active dies. In other embodiments, the dies 140 are passive dies and serve only to interconnect the dies 150 together. In an embodiment, the dies 150 may be electrically coupled to the dies 140 by interconnects 149. The interconnects 149 may be surrounded by an underfill 146.

Figure 2A:
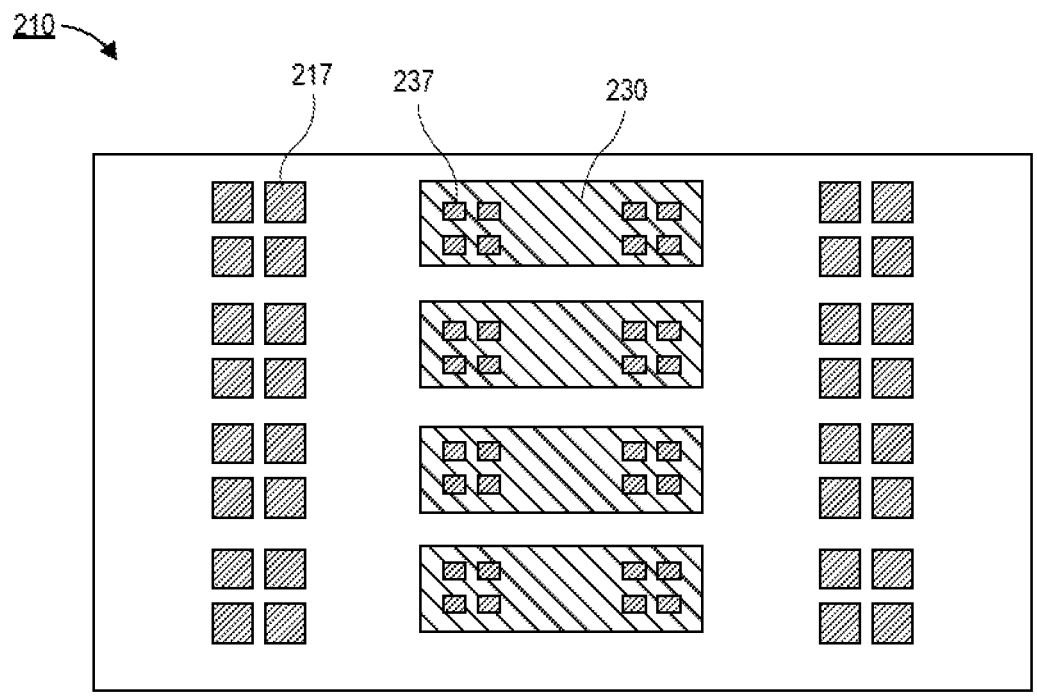
FIG. 2A is a plan view illustration of a plurality of embedded multi-die interconnect bridges (EMIBs) attached to a glass patch, in accordance with an embodiment.

Referring now to FIG. 2A, a plan view illustration of a glass patch 210 with a plurality of bridges 230 on the glass patch 210 is shown, in accordance with an embodiment. In an embodiment, the bridges 230 may be located between first pads 217 of the glass patch 210. In an embodiment, the bridges 230 may comprise pillars 237. In an embodiment, since the glass patch 210 has sufficient thickness to provide a low warpage, highly dimensionally stable platform, the number of bridges 230 can be increased relative to electronic package architectures without a glass core. While four bridges 230 are shown in FIG. 2A, it is to be appreciated that embodiments may include 10 or more bridges 230, or 25 or more bridges 230.

Figure 2B:
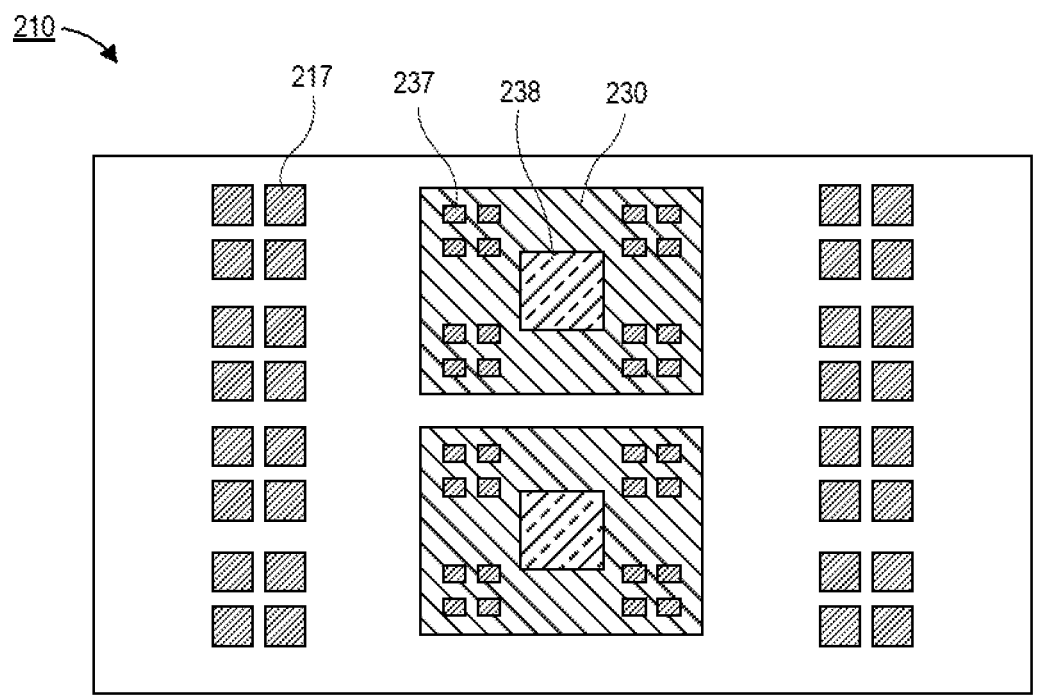
FIG. 2B is a plan view illustration of a plurality of active EMIBs that are attached to a glass patch, in accordance with an embodiment.

Referring now to FIG. 2B, a plan view illustration of a glass patch 210 with a plurality of bridges 230 on the glass patch 210 is shown, in accordance with an embodiment. In an embodiment, the bridges 230 in FIG. 2B are relatively larger than the bridges 230 in FIG. 2A. The increase in size is the result of there being active regions 238 in the bridges 230. The active regions 238 may comprise circuitry, transistors, or the like that are suitable for processing signals. Since the glass patch 210 provides a dimensionally stable and low warpage base, the bridges 230 can be larger than is possible with existing packaging architectures where the bridge is entirely embedded with a dielectric layer.

Figure 3A:
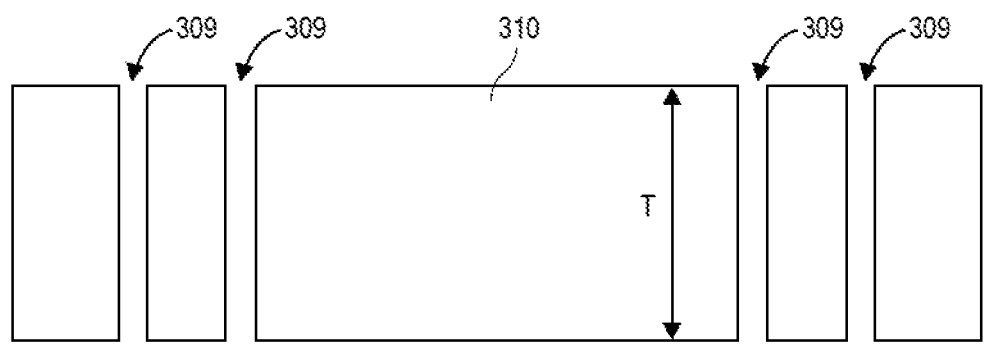
FIG. 3A is a cross-sectional illustration of a glass patch with a plurality of through glass via (TGV) openings, in accordance with an embodiment.
Figure 3B:
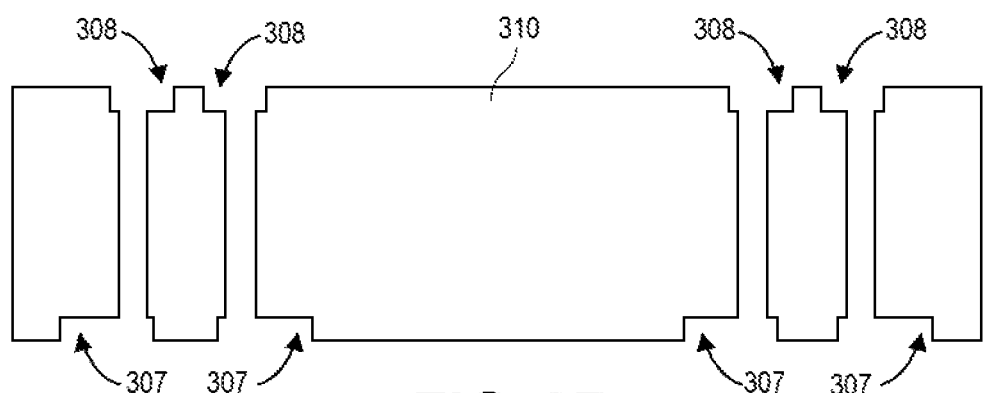
FIG. 3B is a cross-sectional illustration of the glass patch after an integrated fan-out layer is patterned into the glass patch, in accordance with an embodiment.
Figure 3C:
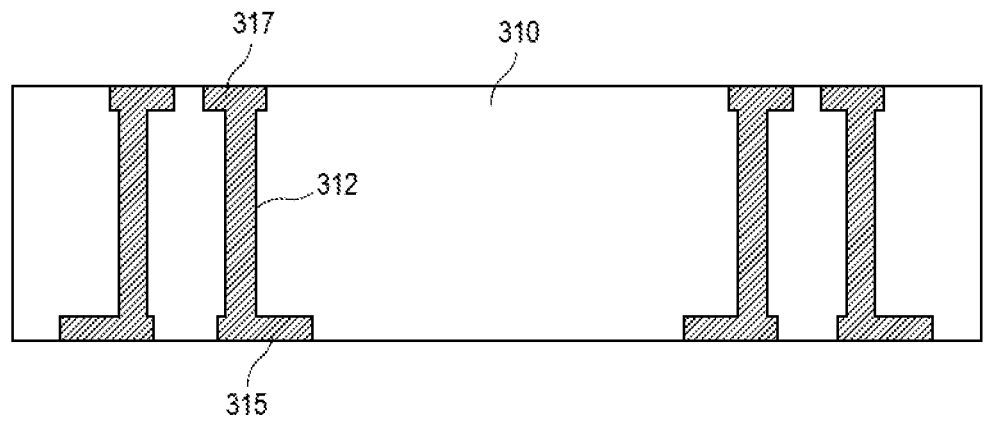
FIG. 3C is a cross-sectional illustration of the glass patch after conductive material is disposed into the openings of the glass patch, in accordance with an embodiment.

Referring now to FIGS. 3A-3C, a series of cross-sectional illustrations that depict a process for forming a glass patch 310 is shown, in accordance with an embodiment. In FIGS. 3A-3C the glass patch 310 is a photo-definable glass material. That is, the glass may be exposed using a patterned mask. The exposed portions of the glass patch may then patterned.

Referring now to FIG. 3A, a cross-sectional illustration of the glass patch 310 after TGV openings 309 are formed is shown, in accordance with an embodiment. In an embodiment, the glass patch 310 may be exposed through a patterned mask. The mask may allow radiation to pass through where a TGV opening 309 is desired. After exposure, the glass patch 310 may be baked. The baking converts the exposed portions of the glass patch 310 into a soluble material. For example, baking may convert the exposed portions of the glass patch 310 into a ceramic that is etch selective to the remainder of the glass patch 310. In an embodiment, the TGV openings 309 may extend entirely through the thickness T of the glass patch 310.

Referring now to FIG. 3B, a cross-sectional illustration of the glass patch 310 after first pad openings 308 and second pad openings 307 are formed into the glass patch 310 is shown, in accordance with an embodiment. In an embodiment, the first pad openings 308 and the second pad openings 307 may be formed by exposing each surface using a different mask. The depth that the first pad opening 308 and the second pad opening 307 extend into the glass patch 310 may be controlled by decreasing the dose of the exposure. For example, the dose to form the TGV openings 309 is larger than the dose to form the first pad openings 308 and the second pad openings 307. After exposure, the glass patch 310 may be baked and etched, similar to the processing used to form the TGV openings 309.

Referring now to FIG. 3C, a cross-sectional illustration of the glass patch 310 after the openings are filled with a conductive material is shown, in accordance with an embodiment. In an embodiment, the conductive material is copper or the like. The conductive material forms first pads 317, TGVs 312, and second pads 315. As shown, the first pads 317 and the second pads 315 are set into the glass patch 310. That is, the exposed surfaces of the first pads 317 and the exposed surfaces of the second pads are substantially coplanar with the top and bottom surfaces, respectively, of the glass patch 310. Furthermore, the second pads 315 provide a horizontal component to the conductive path between the top surface and the bottom surface of the glass patch 310. Accordingly, pitch translation to accommodate a larger pitch interconnect can be implemented entirely within the glass patch 310.

Referring now to FIGS. 4A-4F, a series of plan view illustrations and corresponding cross-sectional illustrations that depict the initial stages of assembling an electronic package are shown, in accordance with an embodiment.

Referring now to FIGS. 4A and 4B, a plan view illustration and a cross-sectional illustration of a carrier substrate 401 is shown, in accordance with an embodiment. In an embodiment, the carrier substrate 401 may be a glass carrier or the like. In an embodiment, an adhesive layer 402 may be disposed over the carrier substrate 401.

Figure 4C:
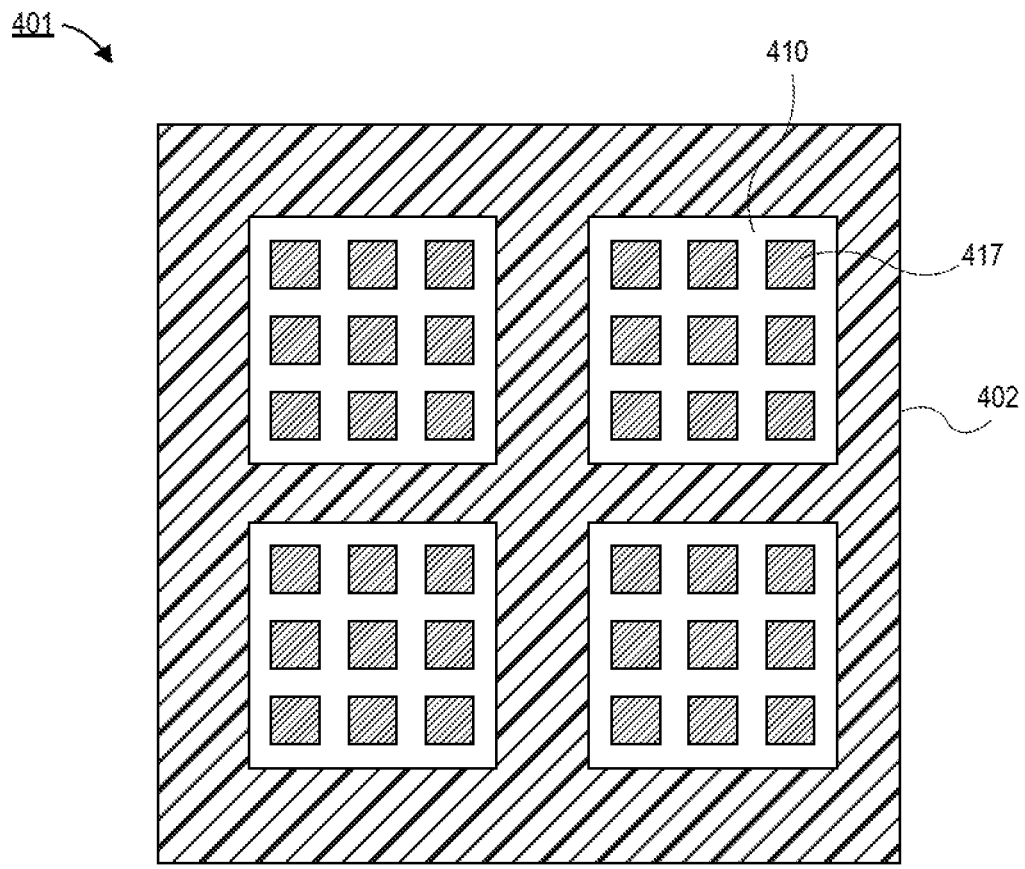
FIG. 4C is a plan view illustration of a plurality of glass patches disposed over the carrier substrate, in accordance with an embodiment.
Figure 4D:
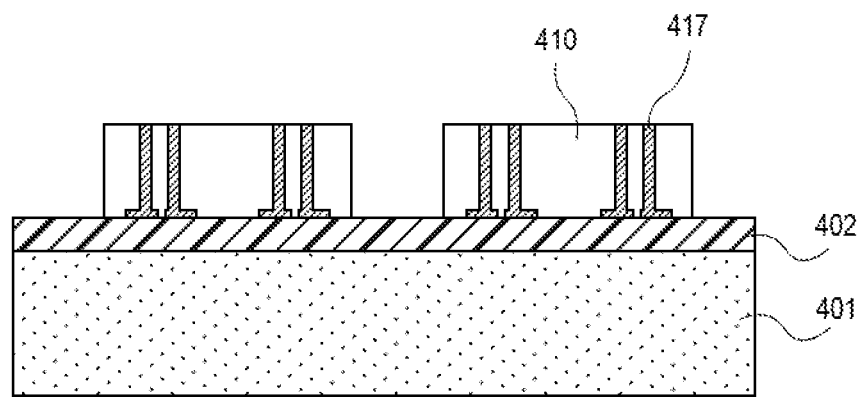
FIG. 4D is a cross-sectional illustration of the carrier in FIG. 4C, in accordance with an embodiment.

Referring now to FIGS. 4C and 4D, a plan view illustration and a cross-sectional illustration of a carrier substrate 401 after a plurality of glass patches 410 are mounted to the carrier substrate 401 is shown, in accordance with an embodiment. In an embodiment, the glass patches 410 may be mounted to the adhesive layer 402 using a pick-and-place tool or the like. In the illustrated embodiment, four glass patches 410 are mounted to the carrier substrate 401. However, it is to be appreciated that any number of glass patches 410 may be attached to the carrier substrate 401. For example, the carrier substrate 401 may be a panel sized substrate, a quarter-panel substrate, a wafer level substrate, or any other desired size.

In an embodiment, the glass patches 410 may be substantially similar to the glass patches 110, 210, and 310 described above. For example, the glass patches 410 may comprise TGVs and pads. For example first pads 417 are shown on the top surface of the glass patches 410.

Figure 4E:
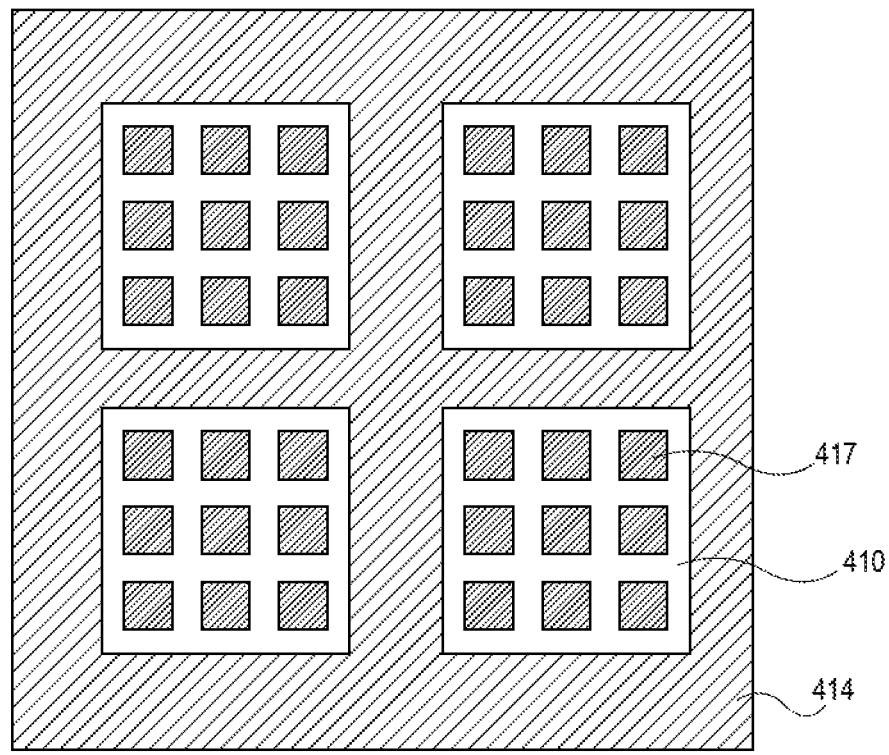
FIG. 4E is a plan view illustration of the carrier after a mold layer is disposed around the glass patches, in accordance with an embodiment.
Figure 4F:
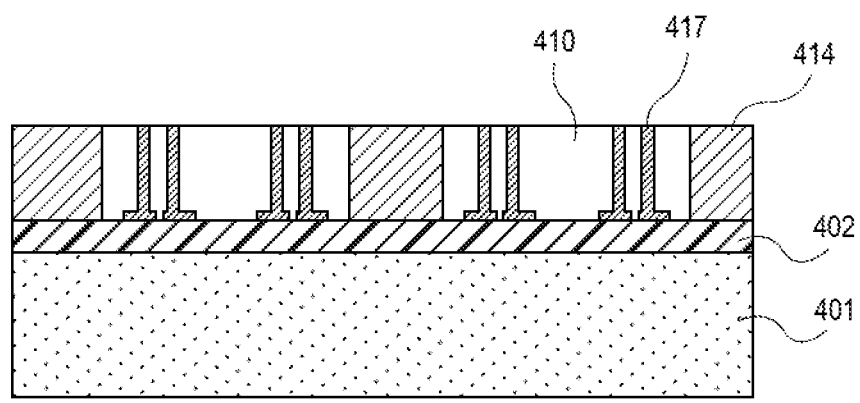
FIG. 4F is a cross-sectional illustration of the carrier in FIG. 4E, in accordance with an embodiment.

Referring now to FIGS. 4E and 4F, a plan view illustration and a cross-sectional illustration of after a mold layer 414 is disposed around the glass patches 410 is shown, in accordance with an embodiment. In an embodiment, the mold layer 414 may be overmolded over a top surface of the glass patches 410 and polished back (e.g., with a polishing process) to expose the first pads 417. The mold layer 414 may fill the spaces between the glass patches 410. That is the sidewall surfaces of the glass patches 410 may be covered by the mold layer 414.

Figure 5A:
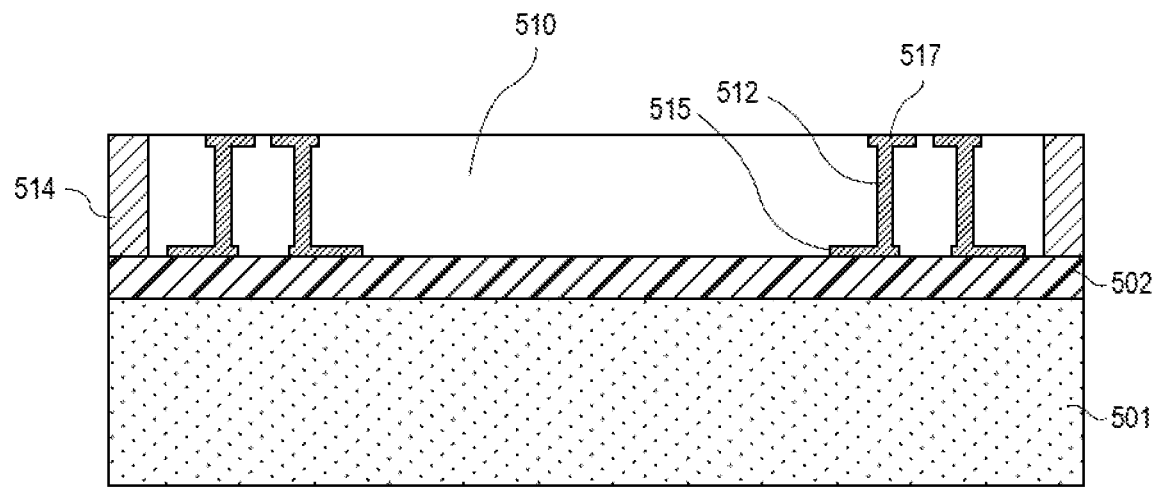
FIG. 5A is a cross-sectional illustration of a glass patch on a carrier, in accordance with an embodiment.

Referring now to FIGS. 5A-5J, a series of cross-sectional illustrations depicting a process for assembling an electronic package 500 with a glass patch is shown, in accordance with an embodiment. The structure starting at FIG. 5A is similar to the structure shown in FIG. 4F, with the exception that only a single glass patch 510 is shown. While a single glass patch 510 is shown in FIGS. 5A-5J for simplicity, it is to be appreciated that any number of electronic packages may be assembled substantially in parallel (e.g., using panel level manufacturing processes).

Referring now to FIG. 5A, a cross-sectional illustration of a glass patch 510 that is adhered to a carrier substrate 501 by an adhesive 502 is shown, in accordance with an embodiment. In an embodiment, the glass patch 510 may comprise a plurality of first pads 517, a plurality of TGVs 512, and a plurality of second pads 515. In an embodiment, the second pads 515 may be in contact with the adhesive 502. In an embodiment, the second pads 515 may be bare copper. In other embodiments, the second pads 515 may include a surface finish (e.g., electroless nickel electroless palladium immersion gold (ENEPIG) or the like). The sidewalls of the glass patch 510 may be lined by a mold layer 514.

Figure 5B:
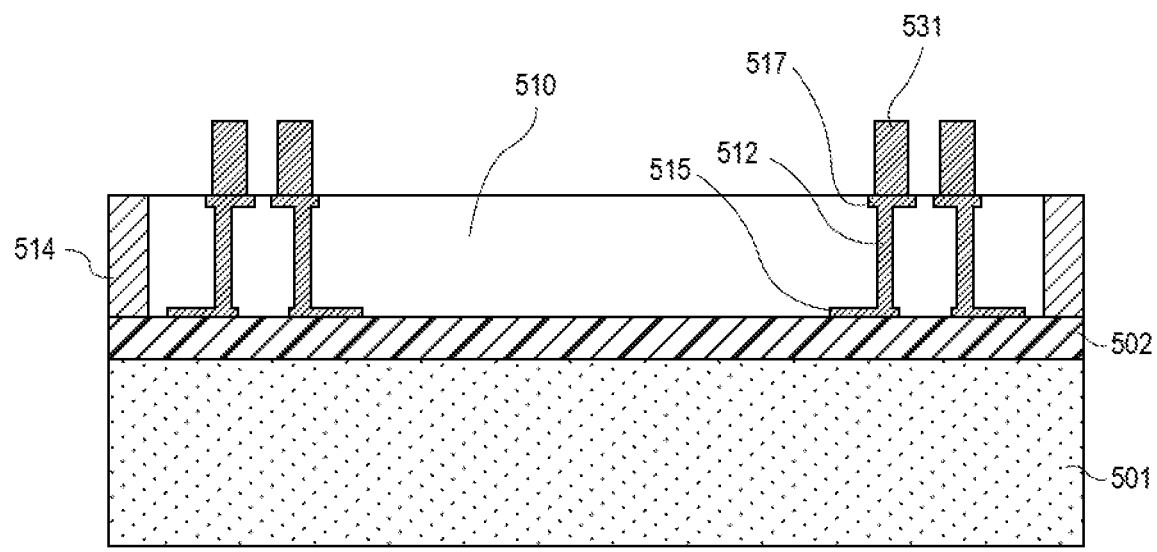
FIG. 5B is a cross-sectional illustration of the glass patch after pillars are disposed over exposed pads of the glass patch, in accordance with an embodiment.

Referring now to FIG. 5B, a cross-sectional illustration of the glass patch 510 after pillars 531 are disposed over the first pads 517 is shown, in accordance with an embodiment. In an embodiment, the pillars 531 provide a vertical conductive path that will pass through a subsequently disposed dielectric layer that embeds the bridge (not shown in FIG. 5B). That is, the pillars 531 may have a thickness that is greater than the thickness of the subsequently attached bridge.

Figure 5C:
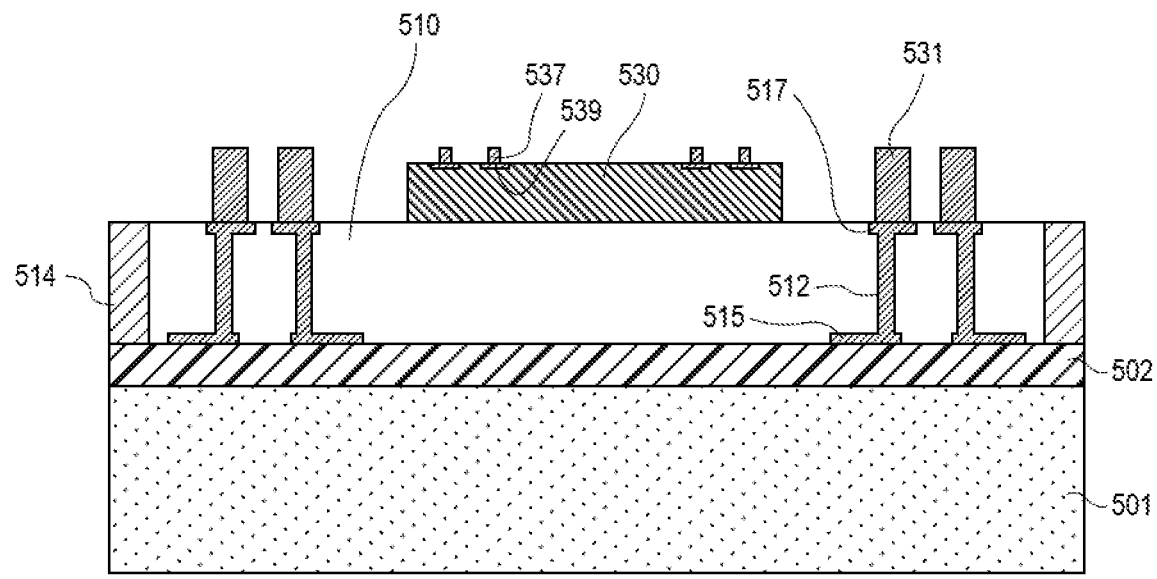
FIG. 5C is a cross-sectional illustration of the glass patch after an EMIR is attached to the glass patch, in accordance with an embodiment.

Referring now to FIG. 5C, a cross-sectional illustration of the glass patch 510 after a bridge 530 is attached is shown, in accordance with an embodiment. In an embodiment, the bridge 530 may be attached directly to the glass patch 510. In other embodiments, an adhesive may couple the bridge 530 to the glass patch 510. In an embodiment, the bridge 530 may comprise pillars 537 that extend up from pads 539.

Figure 5D:
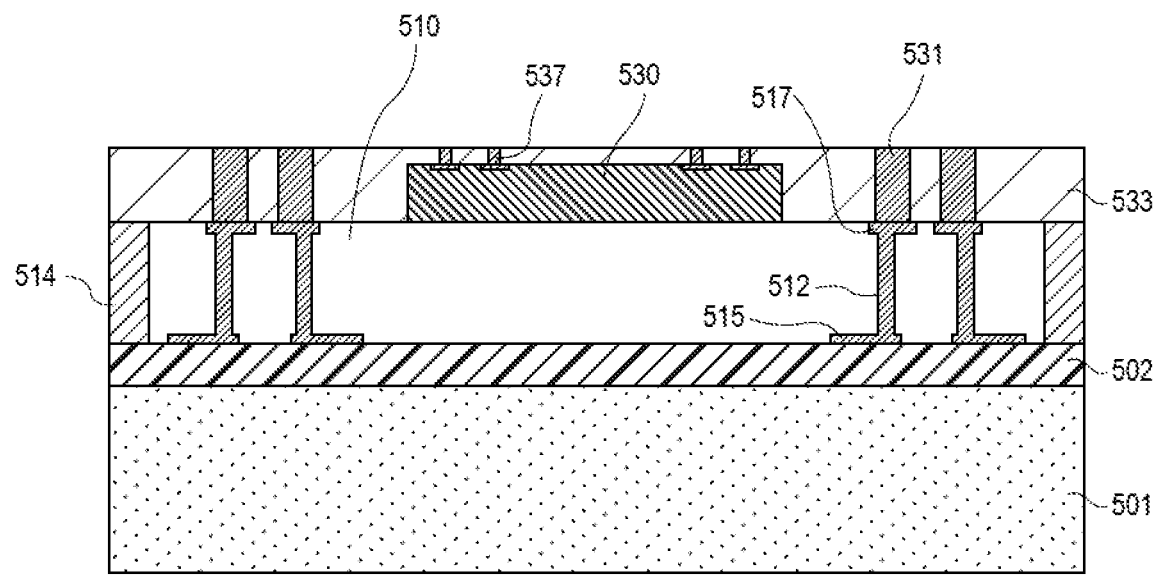
FIG. 5D is a cross-sectional illustration of the glass patch after a dielectric layer is disposed over the glass patch and the EMIB, in accordance with an embodiment.

Referring now to FIG. 5D, a cross-sectional illustration of the glass patch 510 after a dielectric layer 533 is disposed over and around the pillars 531 and the bridge 530 is shown, in accordance with an embodiment. In an embodiment, the dielectric layer 533 may be a laminated layer, a molded layer, or deposited with any other suitable process. The dielectric layer may be a buildup film, a photo-imageable dielectric (PID), an epoxy molding material, or any other dielectric material. In an embodiment, the dielectric layer 533 is disposed above top surfaces of the pillars 531 and the pillars 537 and is subsequently polished back to expose top surfaces of the pillars 531 and top surfaces of the pillars 537. Accordingly, top surfaces of the pillars 537, the pillars 531, and the dielectric layer 533 may all be substantially coplanar with each other.

Figure 5E:
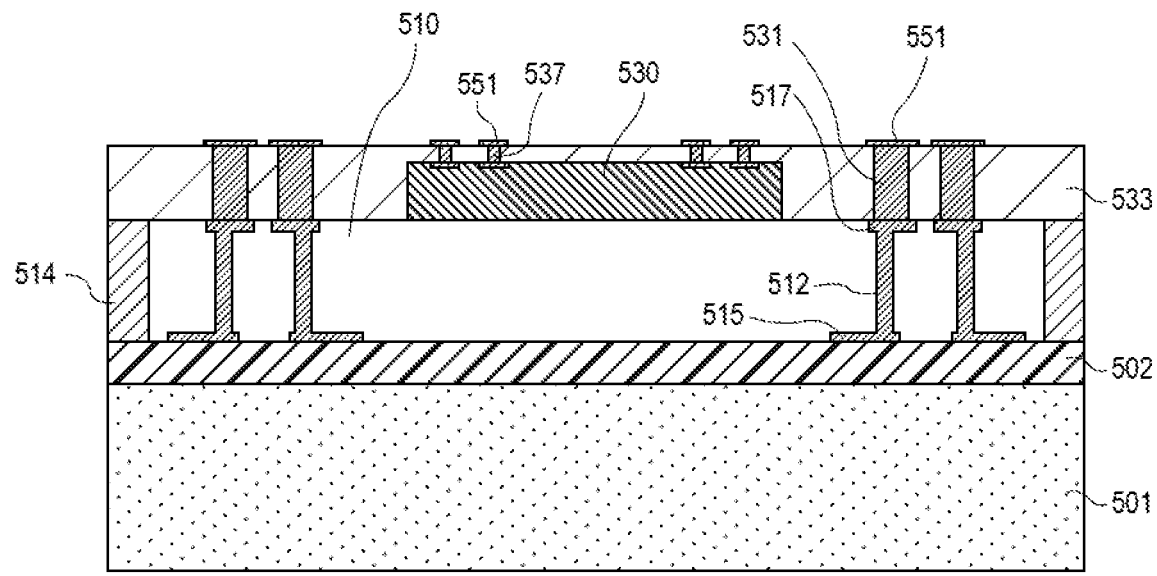
FIG. 5E is a cross-sectional illustration of the glass patch after pads over the dielectric layer are formed, in accordance with an embodiment.

Referring now to FIG. 5E, a cross-sectional illustration of the glass patch 510 after pads 551 are disposed over the pillars 537 and pillars 531 is shown, in accordance with an embodiment. In an embodiment, the pads 551 may be disposed with a standard lithographic patterning process.

Figure 5F:
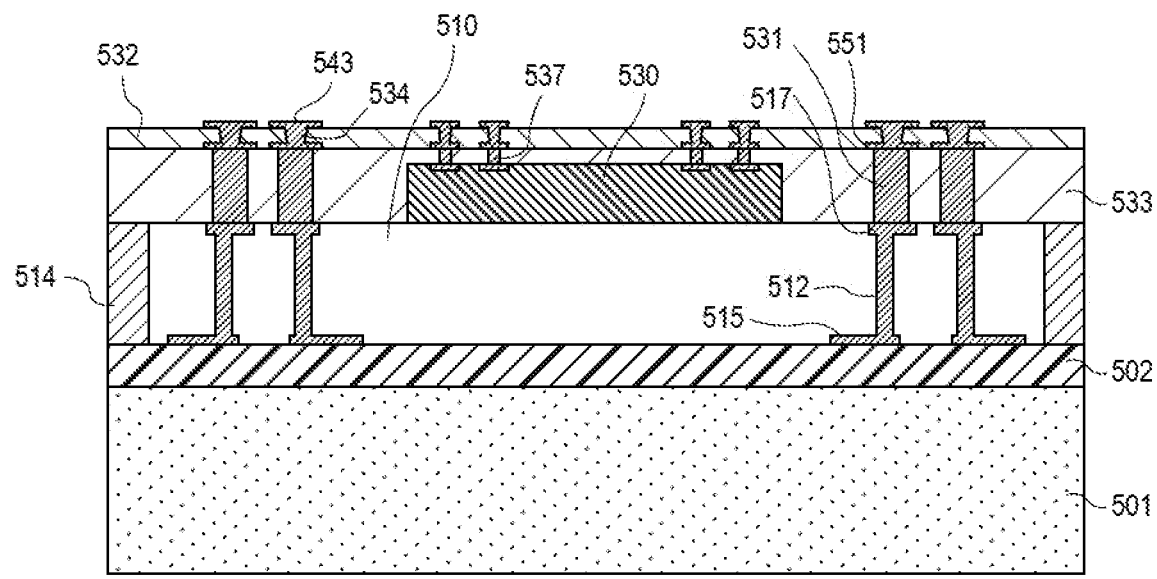
FIG. 5F is a cross-sectional illustration after a solder resist layer is disposed over the dielectric layer, in accordance with an embodiment.

Referring now to FIG. 5F, a cross-sectional illustration of the glass patch 510 after FLI mixed bump plating is implemented is shown, in accordance with an embodiment. In an embodiment, a solder resist 532 is laminated over the pads 551. Interconnects through the solder resist 532 are then formed. In an embodiment, the solder resist 532 over the pillars 531 is exposed and developed to create large openings. Smaller openings through the solder resist 532 are formed over the pillars 537 (e.g., with laser drilling). Vias 534 and additional pads 543 may then be plated. In an embodiment, a surface finish (not shown) may be applied over the pads 543. For example, the surface finish may include an ENEPIG surface finish or the like.

Figure 5G:
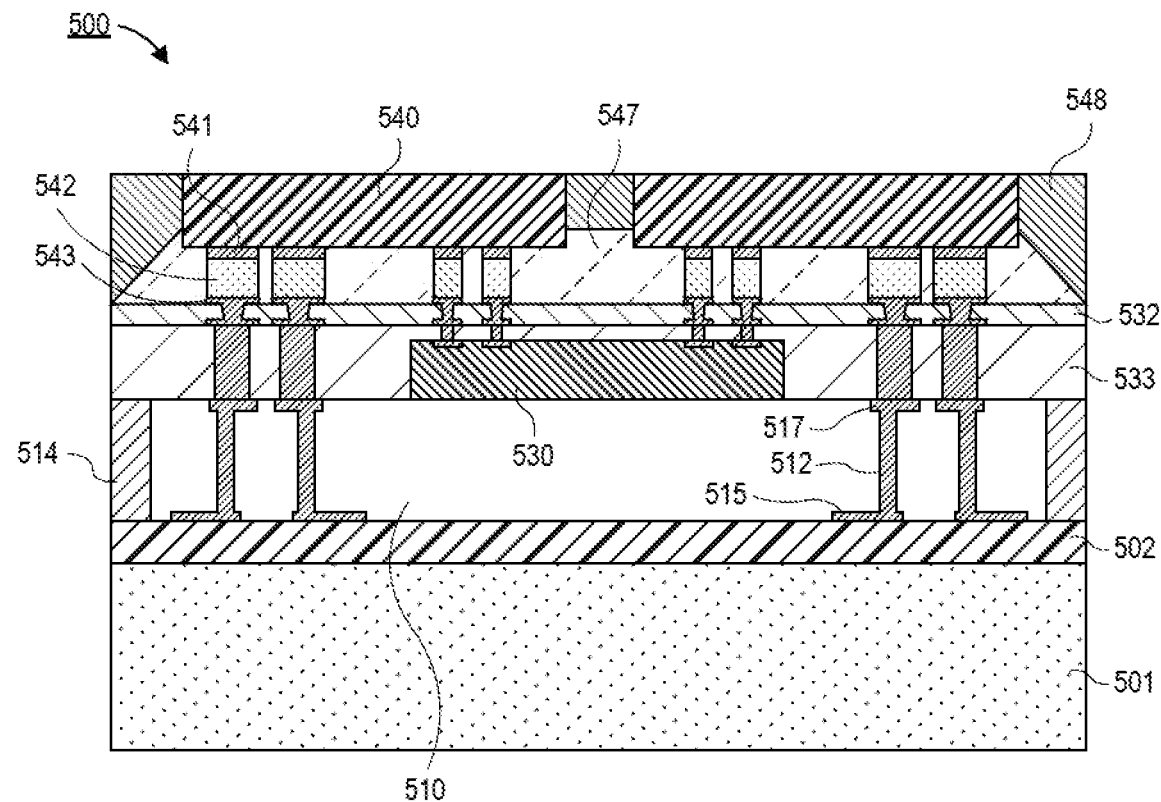
FIG. 5G is a cross-sectional illustration after a plurality of dies are attached to the glass patch, in accordance with an embodiment.

Referring now to FIG. 5G, a cross-sectional illustration of the electronic package 500 after dies 540 are attached to the glass patch 510 is shown, in accordance with an embodiment. In an embodiment, the dies 540 may be attached to pads 543 by FLIs 542 and die bumps 541. The dies 540 may be attached to the glass patch 510 with a TCB process. In an embodiment, the FLIs 542 are surrounded by an underfill layer 547. A mold layer 548 may be disposed over the dies 540 and polished back to expose the backside surfaces of the dies 540. According to an embodiment, the bridge 530 may be electrically couple a first die 540 to a second die 540. The dies 540 may also be electrically coupled to the glass patch 510. In an embodiment, the second pads 515 of the glass patch 510 provide pitch translation for the FLIs 542.

In FIG. 5G, the dies 540 are illustrated as a pair of dies 540. However, it is to be appreciated that embodiments may include any number and configuration of dies 540. For example, the plurality of dies may include stacked dies, similar to the stacked die configuration shown in FIG. 1B. That is, dies 540 may be base substrates onto which a plurality of dies are stacked.

Figure 5H:
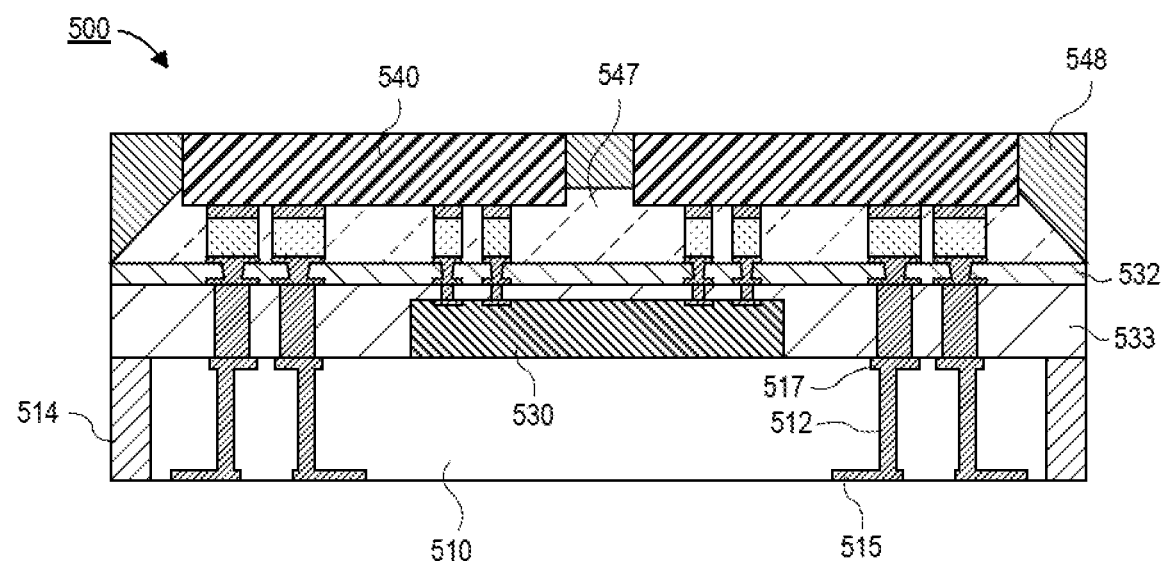
FIG. 5H is a cross-sectional illustration of the glass patch after the carrier substrate is removed, in accordance with an embodiment.

Referring now to FIG. 5H, a cross-sectional illustration of the electronic package 500 after the carrier substrate 501 is removed is shown, in accordance with an embodiment. In an embodiment, the carrier substrate 501 is removed by exposing the adhesive 502 to UV radiation that causes the adhesive 502 to deteriorate and release the glass patch 510. In an embodiment, any residual adhesive 502 may be cleaned off the glass patch 510 with any suitable cleaning process. As such, the second pads 515 of the glass patch 510 are exposed.

Figure 5I:
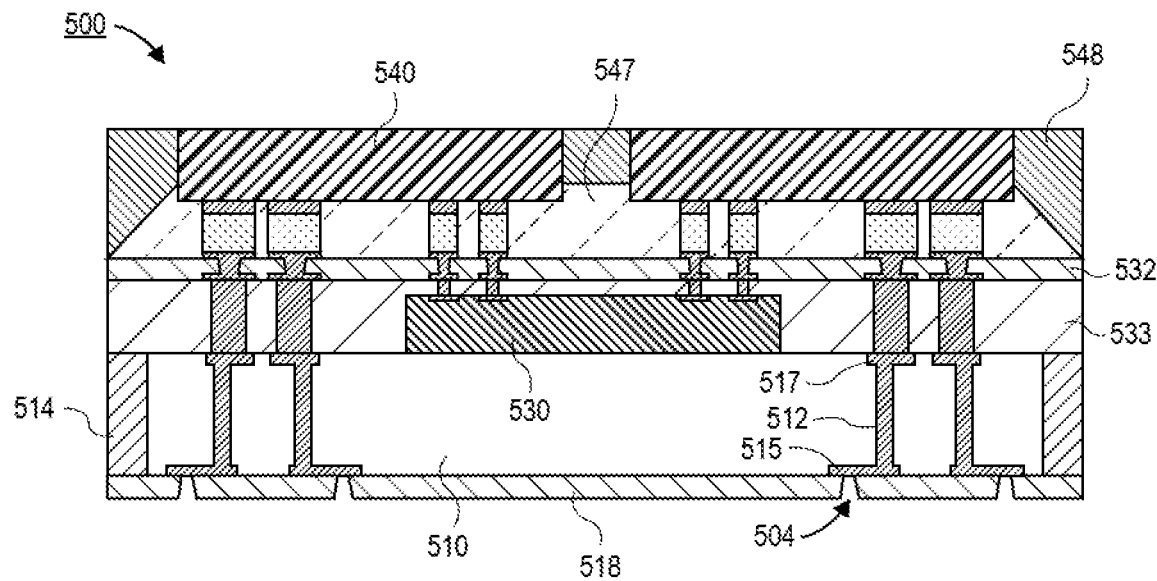
FIG. 5I is a cross-sectional illustration of the glass patch after a solder resist layer is disposed over the bottom surface of the glass patch, in accordance with an embodiment.

Referring now to FIG. 5I, a cross-sectional illustration of the electronic package 500 after a solder resist layer 518 is disposed over the second pads 515 is shown, in accordance with an embodiment. In an embodiment, the solder resist layer 518 may be patterned to form openings 504 to expose portions of the second pads 515.

Figure 5J:
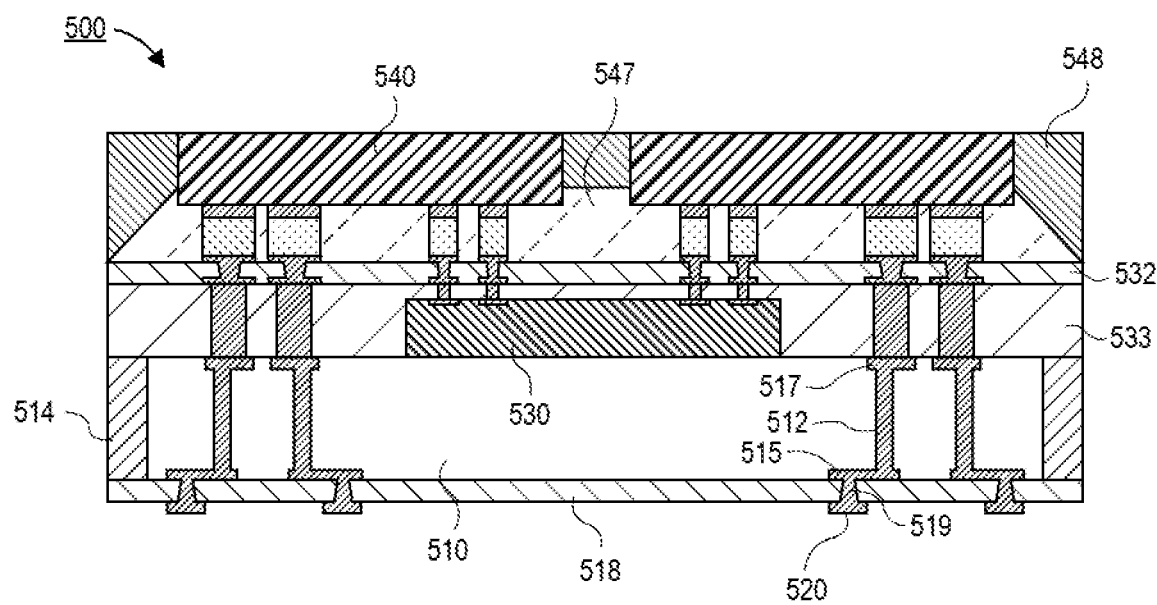
FIG. 5J is a cross-sectional illustration after conductive layers are disposed through the solder resist, in accordance with an embodiment.

Referring now to FIG. 5J, a cross-sectional illustration of the electronic package 500 after vias 519 and mid-level interconnect (MLI) pads 520 are disposed into the openings 504 is shown, in accordance with an embodiment. In an embodiment, the MLI pads 520 may be formed with typical lithography processing operations. In an embodiment, a surface finish (not shown) may be disposed over the MLI pads 520.

In an embodiment, the electronic package 500 may be singulated after the MLI pads 520 are formed. However, it is noted that singulation may also be implemented at any other point in the processing depending on the embodiment. Singulation of the electronic package 500 is done using typical singulation processes. Particularly, since the glass patch 510 is sized for a single electronic package 500, there is no need to cut through a glass layer. That is, the singulation may pass through the mold layer 514 adjacent to the sidewalls of the glass patch 510. Accordingly, embodiments may include an electronic package 500 that comprises a glass patch 510 with sidewall surfaces covered by a mold layer 514.

Figure 6:
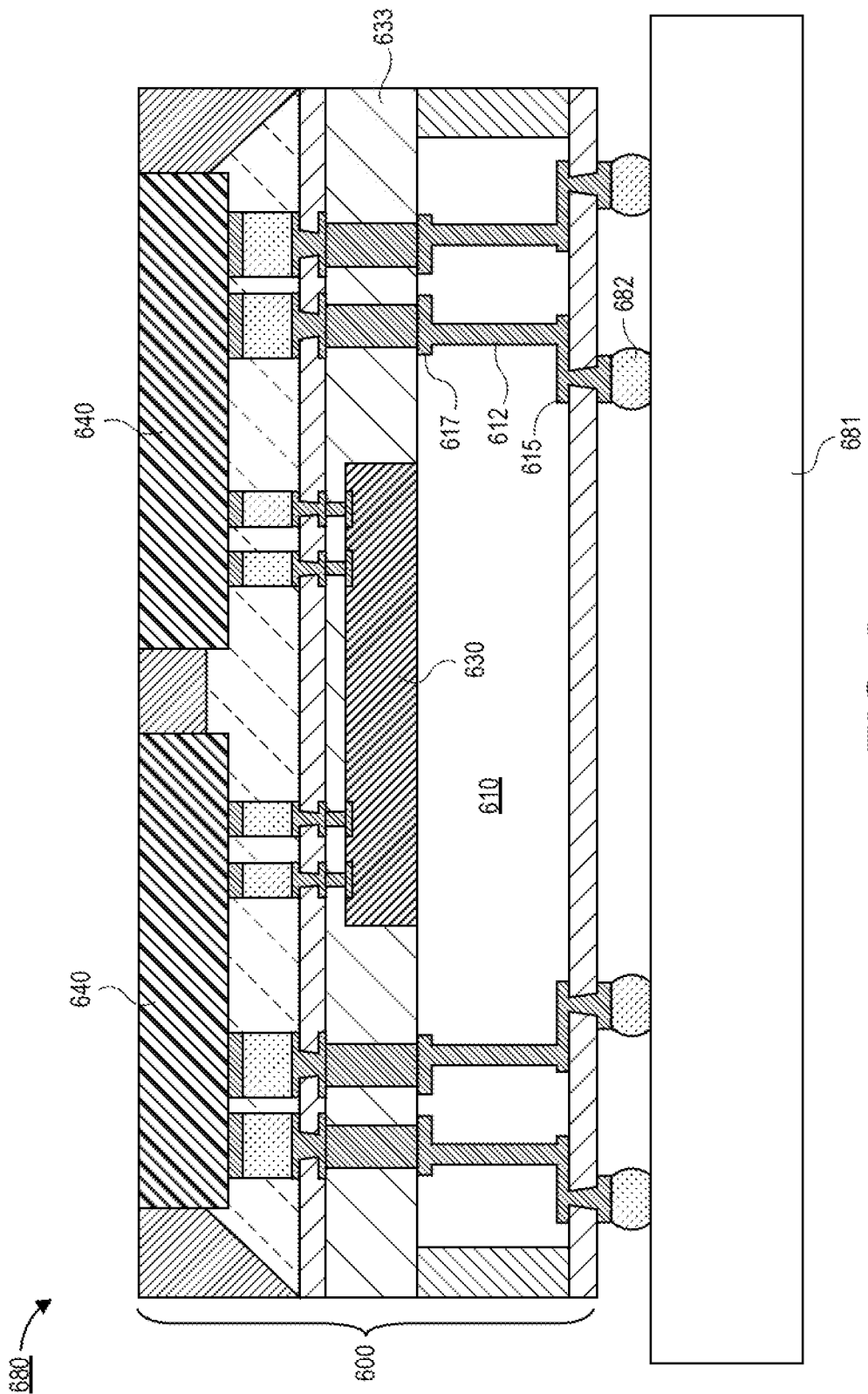
FIG. 6 is a cross-sectional illustration of an electronic system that comprises a glass patch with an integrated fan-out layer, in accordance with an embodiment.

Referring now to FIG. 6, a cross-sectional illustration of an electronic system 680 is shown, in accordance with an embodiment. In an embodiment, the electronic system 680 may comprise an electronic package 600 that is similar to the electronic package 500 in FIG. 5H. For example, the electronic package 600 may comprise a glass patch 610 with a bridge 630 and a plurality of dies 640. In an embodiment, the bridge 630 may be embedded in a dielectric layer 633. The glass patch 610 may comprise first pads 617, TGVs 612 and second pads 615.

In an embodiment, the second pads are electrically coupled to a substrate 681 by MLIs 682. In an embodiment, the substrate 681 may be an interposer. The interposer substrate 681 may be electrically coupled to a board (e.g., a printed circuit board (PCB) that is not illustrated in FIG. 6 for simplicity. In other embodiments, the substrate 681 may be a board, such as a PCB. That is, the electronic package 600 may be directly coupled to a board.

In an embodiment, the electronic package 600 may be coupled to the substrate 681 using a reflow process, such as CAM. The use of a CAM process avoids thermal issues (due to the thermal resistance of the glass patch 610) that would occur if package 600 were bonded to the substrate 681 using TCB. However, such reflow processes require a larger bump pitch than is needed at the die 640. Accordingly, pitch translation is implemented by a fan-out layer (i.e., the second pads 615) of the glass patch 610. As such, the pitch translation is implemented entirely in the glass patch 610 without the need for additional RDLs. Without additional RDLs, the maximum benefit of the glass patch 610 with respect to BTV can be obtained.

Figure 7:
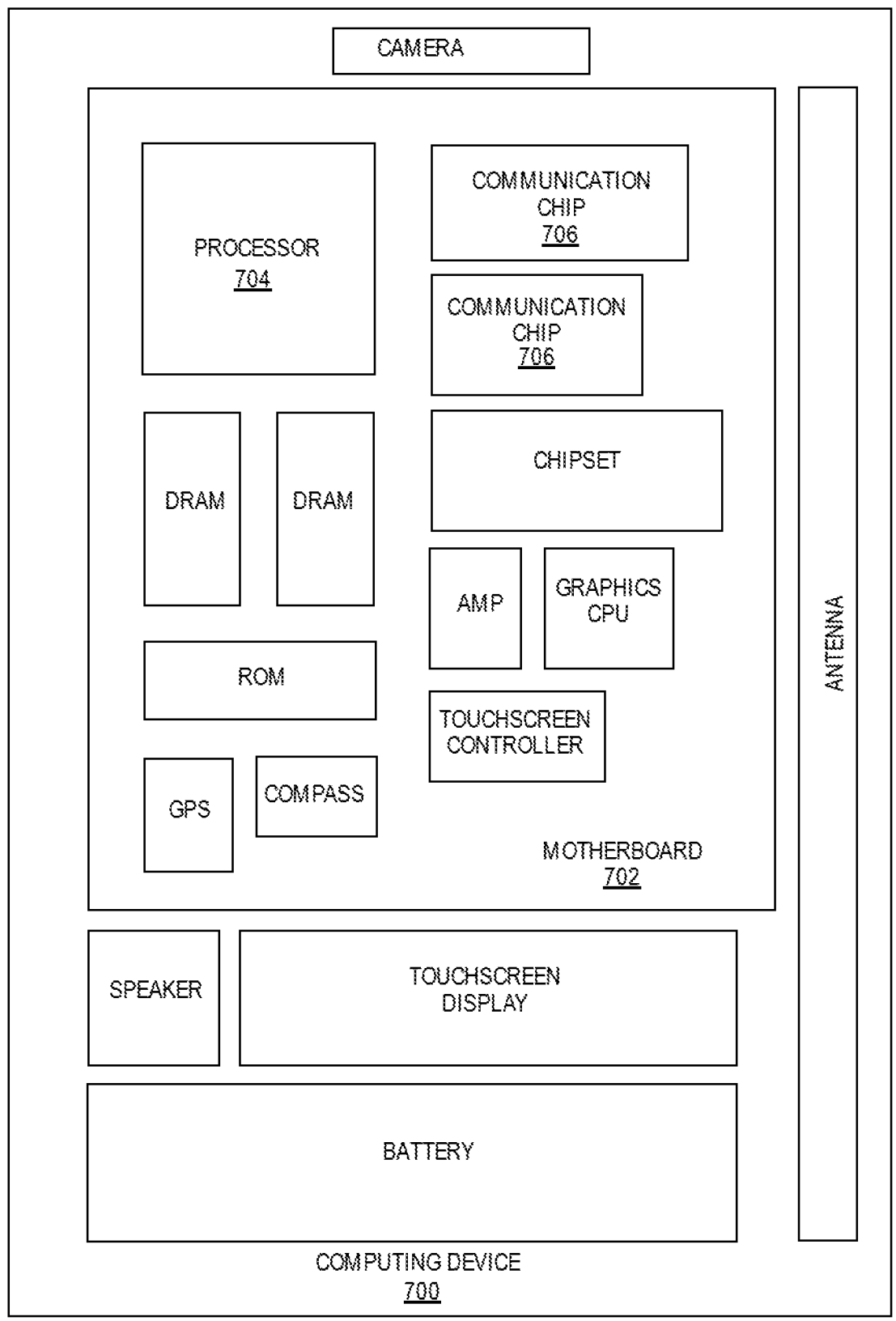
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor 704 may be part of an electronic package that comprises a glass patch with an integrated fan-out layer, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip 706 may be part of an electronic package that comprises a glass patch with an integrated fan-out layer, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a glass substrate, comprising: a plurality of first pads on a first surface of the glass substrate; a plurality of second pads on a second surface of the glass substrate that is opposite from the first surface; a plurality of through glass vias (TGVs), wherein each TGV electrically couples a first pad to a second pad, wherein the plurality of first pads have a first pitch, and wherein the plurality of second pads have a second pitch that is greater than the first pitch; a bridge substrate over the glass substrate; a first die electrically coupled to first pads and the bridge substrate; and a second die electrically coupled to first pads and the bridge substrate, wherein the bridge substrate electrically couples the first die to the second die.

Example 2: the electronic package of Example 1, wherein the second pads are part of a fan-out layer patterned directly into the second surface of the glass substrate.

Example 3: the electronic package of Example 1 or Example 2, wherein the first pitch is less than approximately 100 μm and the second pitch is greater than approximately 100 μm.

Example 4: the electronic package of Example 3, wherein the second pitch is 160 μm or greater.

Example 5: the electronic package of Examples 1-4, wherein the glass substrate has a thickness that is approximately 50 μm or greater.

Example 6: the electronic package of Examples 1-5, wherein the bridge substrate is an active device.

Example 7: the electronic package of Examples 1-6, further comprising: a plurality of bridge substrates.

Example 8: the electronic package of Examples 1-7, further comprising: a mold layer over sidewall surfaces of the glass substrate.

Example 9: the electronic package of Examples 1-8, wherein the glass substrate is a photo-definable glass material.

Example 10: the electronic package of Examples 1-9, further comprising: a plurality of third dies coupled to a top surface of the first die; and a plurality of fourth dies coupled to a top surface of the second die.

Example 11: the electronic package of Example 10, wherein the first die and the second die comprise transistors at a first process node, and wherein the plurality of third dies and the plurality of fourth dies comprise transistors at a second process node that is more advanced than the first process node.

Example 12: a patch substrate, comprising: a glass substrate having a first surface and a second surface opposite from the first surface, wherein the glass substrate is a photo-definable glass material; a plurality of first pads on the first surface, wherein the plurality of first pads comprise a first pitch; a plurality of second pads on the second surface, wherein the plurality of second pads comprise a second pitch that is larger than the first pitch; and a plurality of through glass vias (TGVs) between the first surface and the second surface.

Example 13: the patch substrate of Example 12, wherein each of the first pads are embedded in the first surface, and wherein each of the second pads are embedded in the second surface.

Example 14: the patch substrate of Example 12 or Example 13, wherein the second pads comprise a fan-out layer.

Example 15: the patch substrate of Examples 12-14, wherein the second pitch is approximately 160 µm or greater.

Example 16: the patch substrate of Examples 12-15, wherein pitch translation from the first pitch to the second pitch is provided entirely within the glass substrate.

Example 17: the patch substrate of Examples 12-16, wherein the glass substrate has a thickness between the first surface and the second surface that is approximately 400 µm or greater.

Example 18: a method of assembling an electronic package, comprising: attaching a glass substrate to a carrier substrate, wherein the glass substrate comprises a fan-out layer entirely within the glass substrate; attaching a bridge substrate to the glass substrate; applying a mold layer over the glass substrate and the bridge substrate; attaching a first die and a second die to the glass substrate and the bridge substrate; and removing the carrier substrate.

Example 19: the method of Example 18, wherein the glass substrate is a photo-definable glass material, and wherein the fan-out layer is formed with a lithographic process.

Example 20: the method of Example 17 or Example 19, further comprising: attaching the electronic package to an interposer.

Example 21: the method of Example 20, wherein the electronic package is attached to the interposer with a chip attach module (CAM) process.

Example 22: an electronic system, comprising: a board; and an electronic package electrically coupled to the board, wherein the electronic package comprises: a plurality of dies, wherein two or more dies are electrically coupled together by a bridge substrate; and a glass substrate supporting the plurality of dies, wherein the glass substrate comprises: a fan-out layer, wherein the fan-out layer is entirely within the glass substrate.

Example 23: the electronic system of Example 22, wherein the glass substrate comprises a photo-definable glass material.

Example 24: the electronic system of Example 22 or Example 23, wherein the glass substrate comprises first pads with a first pitch, and second pads with a second pitch, wherein the fan-out layer provides pitch translation between the first pitch and the second pitch.

Example 25: the electronic system of Example 24, wherein the second pitch is approximately 160 µm or greater.

What is claimed is:

1. An electronic package, comprising:
    a glass substrate, comprising:
        a plurality of first pads on a first surface of the glass substrate;
        a plurality of second pads on a second surface of the glass substrate that is opposite from the first surface;
        a plurality of through glass vias (TGVs), wherein each TGV electrically couples a first pad to a second pad, wherein the plurality of first pads have a first pitch, wherein the plurality of second pads have a second pitch that is greater than the first pitch, wherein a first one of the TGVs directly connects a first one of the first pads and a first one of the second pads, wherein a second one of the TGVs directly connects a second one of the first pads and a second one of the second pads, wherein the first one of the first pads and the second one of the first pads have the first pitch, and wherein the first one of the second pads and the second one of the second pads have the second pitch;
    a bridge substrate over the glass substrate;
    a first die electrically coupled to first pads and the bridge substrate; and
    a second die electrically coupled to first pads and the bridge substrate, wherein the bridge substrate electrically couples the first die to the second die.

2. The electronic package of claim 1, wherein the second pads are part of a fan-out layer patterned directly into the second surface of the glass substrate.

3. The electronic package of claim 1, wherein the first pitch is less than 100 µm and the second pitch is greater than 100 µm.

4. The electronic package of claim 3, wherein the second pitch is 160 µm or greater.

5. The electronic package of claim 1, wherein the glass substrate has a thickness that is 50 µm or greater.

6. The electronic package of claim 1, wherein the bridge substrate is an active device.

7. The electronic package of claim 1, further comprising: a plurality of bridge substrates.

8. The electronic package of claim 1, further comprising: a mold layer over sidewall surfaces of the glass substrate.

9. The electronic package of claim 1, further comprising:
    a plurality of third dies coupled to a top surface of the first die; and
    a plurality of fourth dies coupled to a top surface of the second die.

10. The electronic package of claim 9, wherein the first die and the second die comprise transistors at a first process node, and wherein the plurality of third dies and the plurality of fourth dies comprise transistors at a second process node that is more advanced than the first process node.

11. A patch substrate, comprising:
    a glass substrate having a first surface and a second surface opposite from the first surface;
    a plurality of first pads on the first surface, wherein the plurality of first pads comprise a first pitch;
    a plurality of second pads on the second surface, wherein the plurality of second pads comprise a second pitch that is larger than the first pitch; and
    a plurality of through glass vias (TGVs) between the first surface and the second surface, wherein a first one of the plurality of TGVs directly connects a first one of the plurality of first pads and a first one of the plurality of second pads, wherein a second one of the plurality of TGVs directly connects a second one of the plurality of first pads and a second one of the plurality of second pads, wherein the first one of the plurality of first pads and the second one of the plurality of first pads have the first pitch, and wherein the first one of the plurality of second pads and the second one of the plurality of second pads have the second pitch.

12. The patch substrate of claim 11, wherein each of the first pads are embedded in the first surface, and wherein each of the second pads are embedded in the second surface.

13. The patch substrate of claim 12, wherein the second pads comprise a fan-out layer.

14. The patch substrate of claim 11, wherein the second pitch is 160 μm or greater.

15. The patch substrate of claim 11, wherein pitch translation from the first pitch to the second pitch is provided entirely within the glass substrate.

16. The patch substrate of claim 11, wherein the glass substrate has a thickness between the first surface and the second surface that is 400 μm or greater.

17. An electronic system, comprising:
a board; and
an electronic package electrically coupled to the board, wherein the electronic package comprises:
  a plurality of dies, wherein two or more dies are electrically coupled together by a bridge substrate; and
  a glass substrate supporting the plurality of dies, wherein the glass substrate comprises a fan-out layer, wherein the fan-out layer is entirely within the glass substrate, wherein the glass substrate comprises first pads with a first pitch, and second pads with a second pitch, wherein the fan-out layer provides pitch translation between the first pitch and the second pitch, wherein a first one of a plurality of through glass vias (TGVs) directly connects a first one of the first pads and a first one of the second pads, wherein a second one of the plurality of TGVs directly connects a second one of the first pads and a second one of the second pads, wherein the first one of the first pads and the second one of the first pads have the first pitch, and wherein the first one of the second pads and the second one of the second pads have the second pitch.

18. The electronic system of claim 17, wherein the second pitch is 160 μm or greater.

\* \* \* \* \*